US011414202B2

(12) United States Patent
Tomescu et al.

(10) Patent No.: US 11,414,202 B2
(45) Date of Patent: Aug. 16, 2022

(54) PLATE COOLER FOR AIRCRAFT ELECTRONIC COMPONENTS

(71) Applicant: PRATT & WHITNEY CANADA CORP., Longueuil (CA)

(72) Inventors: Dana Tomescu, Brampton (CA);
Guillaume Berton, Brampton (CA)

(73) Assignee: PRATT & WHITNEY CANADA CORP., Longueuil (CA)

( * ) Notice: Subject to any disclaimer, the term of this patent is extended or adjusted under 35 U.S.C. 154(b) by 344 days.

(21) Appl. No.: 16/675,729

(22) Filed: Nov. 6, 2019

(65) Prior Publication Data
US 2021/0130002 A1  May 6, 2021

(51) Int. Cl.
| | |
|---|---|
| *B64D 33/00* | (2006.01) |
| *F28F 3/12* | (2006.01) |
| *F28F 1/02* | (2006.01) |
| *F28F 1/40* | (2006.01) |
| *F28F 9/02* | (2006.01) |
| *H01L 23/473* | (2006.01) |
| *H05K 7/20* | (2006.01) |

(52) U.S. Cl.
CPC .............. *B64D 33/00* (2013.01); *F28F 1/022* (2013.01); *F28F 1/40* (2013.01); *F28F 3/12* (2013.01); *F28F 9/0268* (2013.01); *H01L 23/473* (2013.01); *H05K 7/20272* (2013.01); *H05K 7/20872* (2013.01); *F28F 1/025* (2013.01)

(58) Field of Classification Search
CPC ........ F25D 21/006; F25D 21/02; F25D 21/08; F25D 2700/12; F28D 9/00; F28D 7/00; F28D 9/0037; F28D 1/0308; F28F 3/005; F28F 3/08

USPC ....................... 62/80; 165/165, 164, 166, 167
See application file for complete search history.

(56) References Cited

U.S. PATENT DOCUMENTS

| | | | | | |
|---|---|---|---|---|---|
| 1,662,870 | A | * | 3/1928 | Stancliffe | F28D 9/0037 165/166 |
| 1,828,477 | A | * | 10/1931 | Seligman | F28D 9/0075 165/164 |
| 2,193,405 | A | * | 3/1940 | Goodman | F28F 3/083 165/70 |
| 2,203,123 | A | * | 6/1940 | Astle | F28F 3/083 165/186 |
| 2,288,061 | A | * | 6/1942 | Arnold | F28D 9/0037 165/166 |
| 2,777,674 | A | * | 1/1957 | Wakeman | F28F 3/083 165/167 |

(Continued)

FOREIGN PATENT DOCUMENTS

JP        2019178807 A  * 10/2019  .......... F28D 9/0037

*Primary Examiner* — Justin M Jonaitis
(74) *Attorney, Agent, or Firm* — Norton Rose Fulbright Canada LLP (57) ABSTRACT

A plate cooler or heat exchanger includes a channel plate defining first cooling channels on a first side of the channel plate and second cooling channels on a second side of the channel plate opposite to the first side. The first cooling channels are arranged side-by-side in a first direction of coolant flow from a first common inlet to a first outlet. The second cooling channels are arranged side-by-side in a second direction of coolant flow from a second common inlet separate from the first common inlet to a second outlet separate from the first outlet. The second direction of coolant flow is transverse or counter to the first direction of coolant flow.

15 Claims, 4 Drawing Sheets

(56) References Cited

U.S. PATENT DOCUMENTS

| | | | |
|---|---|---|---|
| 2,872,165 A * | 2/1959 | Wennerberg | F28D 9/005 |
| | | | 165/147 |
| 4,503,908 A * | 3/1985 | Rosman | F28D 9/0018 |
| | | | 165/167 |
| 7,321,494 B2 | 1/2008 | Han | |
| 7,339,792 B2 | 3/2008 | Han | |
| 8,408,282 B2 | 4/2013 | Brand et al. | |
| 9,502,329 B2 | 11/2016 | Nagaune | |
| 9,596,785 B2 | 3/2017 | Brand | |
| 9,953,899 B2 | 4/2018 | Chen et al. | |
| 9,980,415 B2 | 5/2018 | Zhou et al. | |
| 10,156,404 B2 | 12/2018 | Ueda | |
| 10,224,263 B2 | 3/2019 | Provenziani | |
| 2004/0226704 A1 | 11/2004 | Sella et al. | |

\* cited by examiner

PLATE COOLER FOR AIRCRAFT ELECTRONIC COMPONENTS

TECHNICAL FIELD

The application relates generally to heat exchangers in aircraft and, more particularly, to heat exchangers for aircraft electronic components.

BACKGROUND

Electronic components used in aircraft often create heat and as such are generally cooled. Although a variety of cooling options are available, in airborne applications the choices are typically limited by weight, cost, reliability, and so on. Furthermore, since devices requiring cooling may experience differential heating across their bodies, cooling systems must often be over-sized, or include complicated valving etc., to ensure all areas are adequately cooled.

SUMMARY

There is provided a plate cooler for aircraft electronic components, the plate cooler comprising: a channel plate defining first cooling channels on a first side of the channel plate and second cooling channels on a second side of the channel plate opposite to the first side, the first cooling channels arranged side-by-side in a first direction of coolant flow from a first common inlet to a first outlet, the second cooling channels arranged side-by-side in a second direction of coolant flow from a second common inlet separate from the first common inlet to a second outlet separate from the first outlet, the second direction of coolant flow being transverse or counter to the first direction of coolant flow.

There is provided a method of distributing coolant through a plate cooler for aircraft electronic components, the method comprising: directing the coolant through first cooling channels on a first side of the plate cooler along a first direction of coolant flow; and directing the coolant through second cooling channels on a second side of the plate cooler along a second direction of coolant flow transverse or counter to the first direction of coolant flow.

There is provided a heat exchanger for aircraft electronic components, comprising: a channel plate defining first cooling channels on a first side of the channel plate and second cooling channels on a second side of the channel plate opposite to the first side, the first cooling channels arranged side-by-side in a first direction of coolant flow from a first common inlet to a first outlet, the second cooling channels arranged side-by-side in a second direction of coolant flow from a second common inlet separate from the first common inlet to a second outlet separate from the first outlet, the second direction of coolant flow being transverse or counter to the first direction of coolant flow; and an upper plate mounted to the first side of the channel plate to enclose the first cooling channels, and a lower plate mounted to the second side of the channel plate to enclose the second cooling channels.

DESCRIPTION OF THE DRAWINGS

Reference is now made to the accompanying figures in which.

DETAILED DESCRIPTION

Figure 1A:
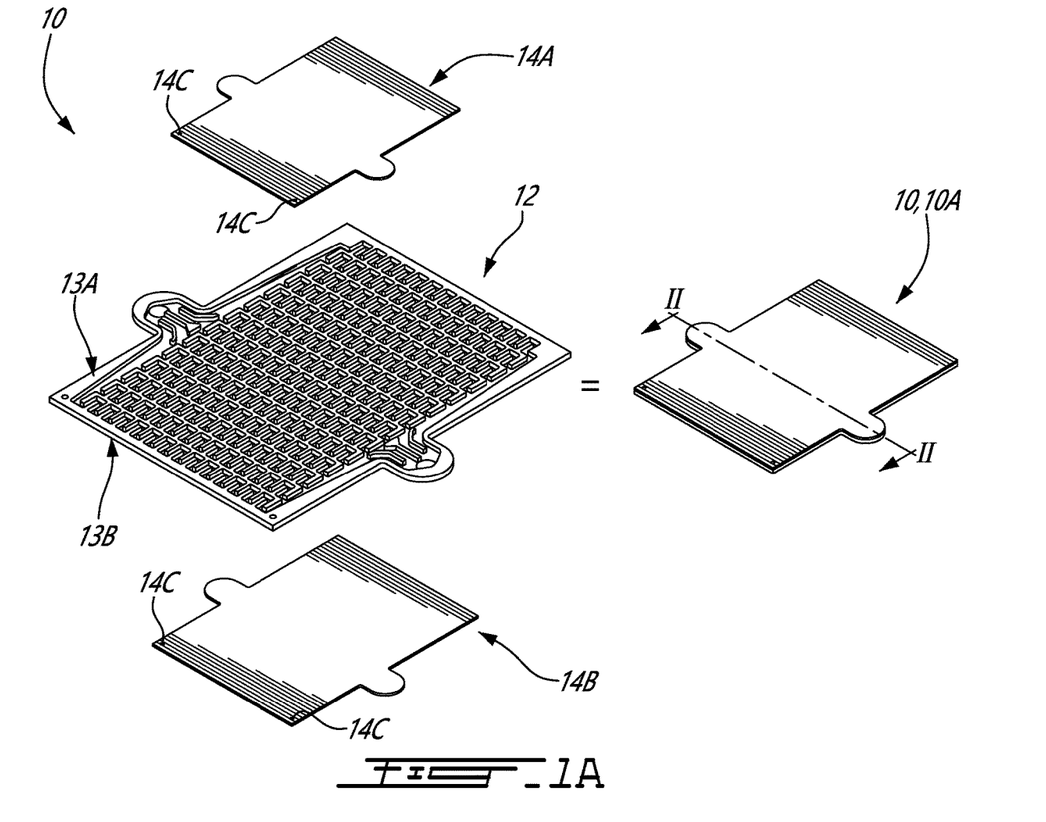
FIG. 1A shows an exploded and assembled view of a heat exchanger.

Referring to FIG. 1A, a plate cooler 10 for a heated surface is shown in an exploded view and an assembled view. The plate cooler 10 is used in the depicted embodiment to remove heat from electronic components in aircraft, such as power electronic equipment. The heat is transferred to one or more coolants passing through the plate cooler 10.

Figure 1B:
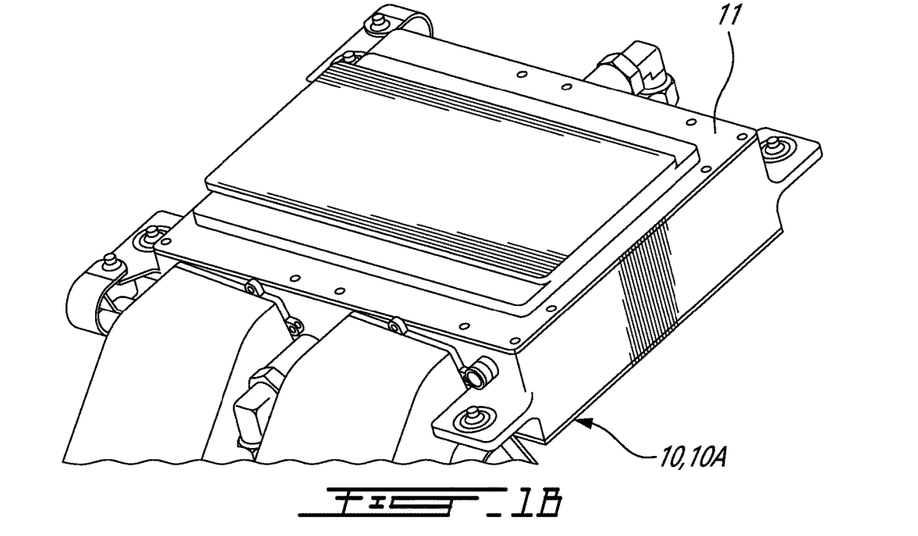
FIG. 1B shows the heat exchanger of FIG. 1A mounted to an aircraft electronic component.

One possible example of an aircraft electronic component that may be cooled by the plate cooler 10 is a power control unit (PCU) 11 of a gas turbine engine of the aircraft, which is shown in FIG. 1B. The PCU 11 may be part of a hybrid electric propulsion system for an aircraft. The plate cooler 10 is mounted to one side of the PCU 11, which in FIG. 1B is the underside of the PCU 11, to receive heat from the PCU 11 and to direct heated coolant(s) away from the PCU 11. In FIG. 1B, the plate cooler 10 has a substantially horizontal orientation, such that the PCU 11 sits on top of the plate cooler 10. Other aircraft electronic components may be used with the plate cooler 10. Although the plate cooler 10 is described herein as being used to remove heat from a device or component, it will be appreciated that the plate cooler 10 may also be used with minimal adaptation to transfer heat to a device or component. Thus, the use of the words "cooler", "cooling", or "coolant" herein do not limit the plate cooler 10 to being used only to remove heat. In this regard, the plate cooler 10 is a heat exchanger 10A, which may employ any suitable heat-exchange fluid to exchange heat energy with a device or component. Non-limiting examples of suitable coolant or heat-exchange fluids include aircraft fuel, oil, refrigerant, water, and hydraulic fluids.

Referring to FIG. 1A, the plate cooler 10 has a channel plate 12 through which the coolant flows. The plate cooler 10 includes a first plate 14A mounted to a face or side of the channel plate 12. The plate cooler 10 includes a second plate 14B mounted to a face or side of the channel plate 12 that is opposite to the face or side against which the first plate 14A is mounted. Electronic components, such as the PCU 11, may be mounted on top of one or both of the first and second plates 14A,14B. The first and second plates 14A,14B may include mounting holes 14C on an outer surface thereof for mounting the electronic component to the first and second plates 14A,14B. The first and second plates 14A,14B may thus be considered electronic component mounting plates. The channel plate 12, the first plate 14A and the second plate 14B are coupled together to form the plate cooler 10. In FIG. 1A, the plate cooler 10 has a horizontal orientation, such that the first plate 14A is an upper plate and the second plate 14B is a lower plate. The plate cooler 10 may have a different orientation, and thus so too may the first and second plates 14A,14B. In FIG. 1A, the first plate 14A is mounted to a first side of the channel plate 12 and the second plate 14B is mounted to a second side of the channel plate 12, such that the first and second plates 14A,14B are in heat exchange relationship with the channel plate 12. By "heat exchange relationship", it is understood that the first and second plates 14A,14B are mounted to the channel plate 12 so that heat energy can be transferred from the electronic component, to the first plate 14A and/or to the second plate 14B, and ultimately to the channel plate 12. When mounted to the channel plate 12, the first and second plates 14A,14B seal the volume defined between the channel plate 12 and the first and second plates 14A,14B, such that any coolant which enters the volume is confined thereto. The channel, first, and second plates 12,14A,14B may be made of aluminum, but may alternatively be made from other types of heat conducting material, such as an aluminum alloy.

Referring to FIG. 1A, the channel plate 12 has a first side 13A and a second side 13B. The first and second sides 13A,13B are opposite one another. The first and second sides 13A,13B are oriented or facing in opposite directions. For example, where the plate cooler 10 has a horizontal orientation, the first side 13A faces upwardly and the second side 13B faces downwardly. In FIG. 1A, the first side 13A is defined along one wall of the channel plate 12 and the second side 13B is defined along another wall of the channel plate 12.

Figure 2:
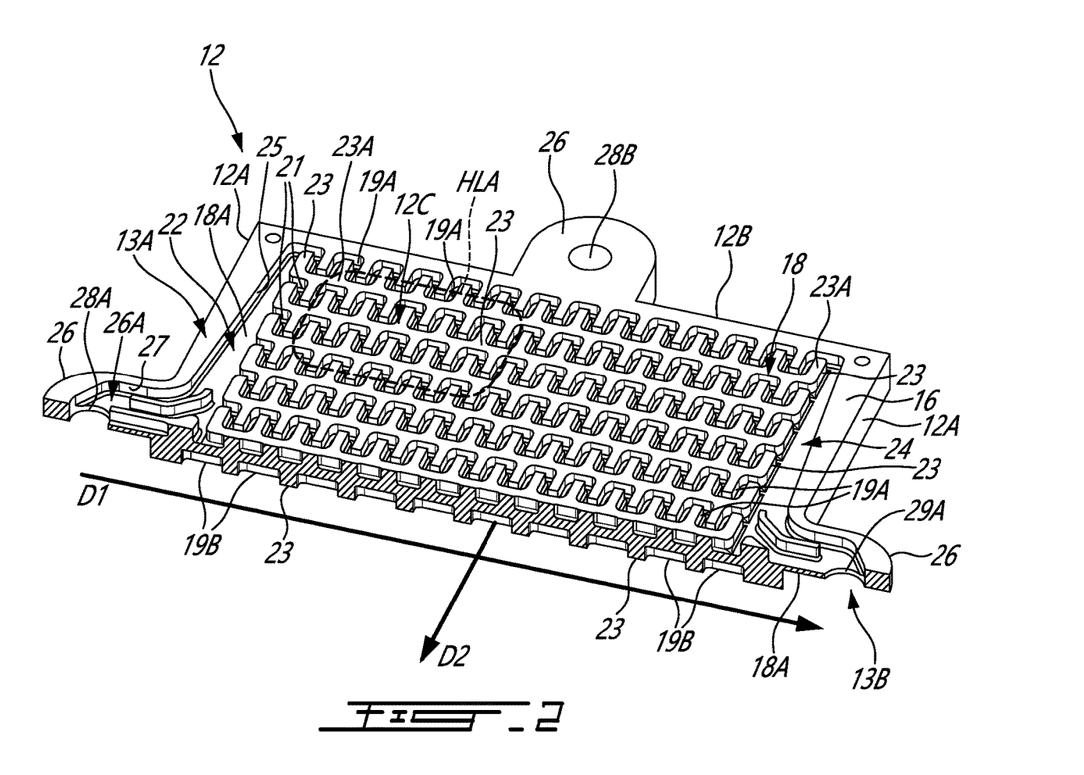
FIG. 2 is a perspective view of the heat exchanger of FIG. 1A, being sectioned along line II-II in FIG. 1A to show an interior thereof.

Referring to FIG. 2, channel plate 12 has a recessed area 18 on both of its first and second sides 13A,13B. FIG. 2 shows the recessed area 18 along the first side 13A of the channel plate 12. The recessed area 18 is a portion of the channel plate 12 that is recessed, or spaced inwardly into the channel plate 12, from the outer surface 16 to which the first plate 14A is mounted. The recessed area 18 includes a bottom or floor 18A of the channel plate 12, which is spaced inwardly into the channel plate 12 from the outer surface 16. Coolant flows through the channel plate 12 by flowing along the floor 18A. As described in greater detail below, multiple fluid paths for the coolant are defined along and through the recessed area 18.

The recessed area 18 on the first side 13A of the channel plate 12 includes multiple first cooling channels 19A, and the recessed area 18 on the second side 13B of the channel plate 12 includes multiple second cooling channels 19B. The first and second cooling channels 19A,19B are fluidly independent, such that the coolant flowing through the first cooling channels 19A does not mix or engage with the coolant flowing through the second cooling channels 19B, and vice versa. The coolant flowing through the first cooling channels 19A follows a flow path that is distinct from the coolant flowing through the second cooling channels 19B.

The recessed area 18 on the first side 13A and the first cooling channels 19A are shown in FIG. 2, and are now described in greater detail. The first cooling channels 19A are located in a side-by-side, parallel arrangement. The recessed area 18 has a fluid supply manifold 22 in fluid flow communication with inlets 21 of the first cooling channels 19A for supplying coolant thereto, and a fluid exit manifold 24 in fluid flow communication with a second opposed end of the first cooling channels 19A having outlets for discharging coolant therefrom. The fluid supply and exit manifolds 22,24 face each other from opposed sides of the first cooling channels 19A and are transversely disposed with respect thereto. In FIG. 2, the channel plate 12 has a generally rectangular contour with protrusions 26 extending outwardly from longitudinal and lateral side walls 12A,12B of the channel plate 12. Other shapes or contours for the channel plate 12 are possible. The protrusions 26 are located on different and opposite longitudinal side walls 12A of the channel plate 12 and are located in the same horizontal plane as the channel plate 12. Some of the protrusions 26 are laterally aligned on the opposite sides of the channel plate 12. Some of the protrusions 26 are positioned along the same line being parallel to the lateral side walls 12B of the channel plate 12. In FIG. 2, some of the protrusions 26 are positioned closer to one of the lateral side walls 12B of the channel plate 12 than to the other lateral side wall 12B. The plate cooler 10 shown in FIG. 2 is thus "asymmetric". In an alternate embodiment, the protrusions 26 are spaced equidistantly between the lateral side walls 12B of the channel plate 12. In such an embodiment, the plate cooler 10 is "symmetric". One of the protrusions 26 includes a first manifold or first fluid inlet 28A, while the other protrusion 26 includes a first manifold or first fluid outlet 29A. The first fluid inlet 28A in FIG. 2 is an opening extending through the channel plate 12, and is in fluid flow communication with the fluid supply manifold 22 for supplying coolant thereto. The first fluid inlet 28A is thus common to all of the first cooling channels 19A because it supplies the coolant to the inlets 21 of all the first cooling channels 19A. The first fluid outlet 29A in FIG. 2 is an opening extending through the channel plate 12, and is in fluid flow communication with the fluid exit manifold 24 for discharging the coolant from the channel plate 12. The first fluid outlet 29A is thus common to all of the first cooling channels 19A because it receives the coolant discharged from the outlets of all the first cooling channels 19A. The channel plate 12 may include a safety channel defined in the channel plate 12 and circumscribing the first cooling channels 19A, the fluid supply and fluid exit manifolds 22,24, and the first fluid inlet and outlets 28A,29A.

Still referring to FIG. 2, the first cooling channels 19A are provided for having coolant flow therethrough from their inlets 21. The inlets 21 are arranged side-by-side, and spaced apart from each other in a direction parallel to the longitudinal side walls 12A of the channel plate 12. The first cooling channels 19A may have a zigzag type configuration with rectangular cross sections, which in the embodiment shown, are all identical. In another embodiment, the first cooling channels 19A may have different configurations with respect to one another. In FIG. 2, the first cooling channels 19A define a tortuous or serpentine flow path between their ends, and between the fluid supply and exit manifolds 22,24. This helps to increase the turbulence of the coolant flowing in the first cooling channels 19A. The first cooling channels 19A geometry may be as described in U.S. Pat. No. 8,408,282 B2 to assignee Pratt & Whitney Canada Corp., the entire contents of which are incorporated by reference herein.

Referring to FIG. 2, the first cooling channels 19A are defined between channel separators 23 which protrude from the floor 18A of the recessed area 18. The channel separators 23 are any bodies which have side walls transverse to the floor 18A so that the flow of coolant is confined to one of the first cooling channels 19A defined between adjacent channel separators 23. The channel separators 23 thus define multiple fluid paths for the coolant through the recessed area 18. In FIG. 2, the outer surface 23A of the channel separators 23 is at the same height from the floor 18A as the outer surface 16 of the channel plate 12. In FIG. 2, the outer surface 23A of the channel separators 23 is in the same horizontal plane as the outer surface 16 of the channel plate 12. In FIG. 2, the outer surface 23A of the channel separators 23 is level with the outer surface 16 of the channel plate 12. Thus, when the first plate 14A is mounted to the first side 13A of the channel plate 12, a surface of the first plate 14A engages the outer surface 23A of the channel separators 23. This forms a seal with the outer surface 23A and with the outer surface 16 of the channel plate 12, thereby enclosing the first cooling channels 19A. The coolant is therefore confined to flowing in the fluid supply and exit manifolds 22,24, and in the first cooling channels 19A. In an alternate embodiment, the outer surface 23A of the channel separators 23 is closer to the floor 18A than the outer surface 16 of the channel plate 12, but still high enough to guide coolant through the first cooling channels 19A.

Referring to FIG. 2, the channel plate 12 has channel separators 23 extending away from the floor 18A on the second side 13B of the channel plate 12 and defining the second cooling channels 19B. The description of the channel separators 23 on the first side 13A of the channel plate 12 applies mutatis mutandis to the channel separators 23 on the second side 13B. The floors 18A and channel separators 23 on both sides 13A,13B of the channel plate 12 are integral. They form a one-piece or uniform body in FIG. 2. A distance separates the floors 18A on both sides 13A,13B of the channel plate 12, and defines a thickness of the channel plate 12. The integrality of the floors 18A and channel separators 23 on both sides 13A,13B of the channel plate 12 may result from how the channel plate 12 is manufactured. For example, the first and second cooling channels 19A,19B may be machined from a single piece of material forming the channel plate 12, on both of its sides 13A,13B. The machined channel plate 12 may then be diffusion bonded with the first and second plates 14A,14B to enclose the first and second cooling channels 19A,19B. In another manufacturing example which results in the floors 18A and channel separators 23 on both sides 13A,13B of the channel plate 12 being integral, the channel plate 12 and its channel separators 23 are made by additive manufacturing.

In an alternate embodiment, a recessed area 18 with the first cooling channels 19A is formed in the first plate 14A, and another recessed area 18 with the second cooling channels 19B is formed in the second plate 14B. The first and second plates 14A,14B are then coupled or bonded to the channel plate 12, which in this embodiment is free of channels. The first and second sides 13A,13B of the channel plate 12 in this embodiment enclose the first and second cooling channels 19A,19B formed in the first and second plates 14A,14B. In yet another embodiment, both the channel plate 12 and the first and second plates 14A,14B may contain portions of the channel geometry, for example, a section of the channels (e.g. 50%) may be present in the channel plate 12 and another section of the channels (e.g. 50%) may be present in the mating first and second plates 14A,14B on either side.

Referring to FIG. 2, the fluid supply manifold 22 is part of the recessed area 18 on the first side 13A of the channel plate 12. The fluid supply manifold 22 is defined by the floor 18A of the recessed area 18, and inner walls 25 of the channel plate 12 which delimit part of the recessed area 18. The inner walls 25 are perpendicular to the floor 18B in FIG. 2 and project away therefrom. The inner walls 25 delimit and define the fluid supply manifold 22 for directing the coolant toward the inlets 21 of the first cooling channels 19A. The inner walls 25 thus delimit and define portions of the fluid supply manifold 22 that extend laterally from opposed sides of the first fluid inlet 28A and transverse to the first cooling channels 19A. The inner walls 25 extend outwardly from the protrusions 26 and toward the first cooling channels 19A such that the fluid supply manifold 22 decreases in spacing or narrows toward the lateral side walls 12B of the channel plate 12. Coolant which enters the first fluid inlet 28A and into the fluid supply manifold 22 is thus directed by the inner walls 25 toward the inlets 21 of the first cooling channels 19A. The structure and layout of the fluid exit manifold 24 is similar to that of the fluid supply manifold 22, and thus the description of the fluid supply manifold 22 herein applies mutatis mutandis to the fluid exit manifold 24.

Referring to FIG. 2, the recessed area 18 on the first side 13A of the channel plate 12 includes and extends to the protrusions 26. A recessed protrusion area 26A is part of the recessed area 18. The recessed protrusion area 26A is delimited and defined by the floor 18A of the recessed area 18, and inner protrusion walls 27 of the protrusions 26. The inner protrusions walls 27 are perpendicular to the floor 18B in FIG. 2B, and project away therefrom. Coolant which enters the first fluid inlet 28A and into the recessed protrusion area 26A is thus directed by the inner protrusion walls 27 toward the fluid supply manifold 22. In FIG. 2, the depth of the recessed area 18 (i.e. the distance of the floor 18A from the outer surface 16 of the channel plate 12) is the same in the recessed protrusion area 26A, the fluid supply and exit manifolds 22,24, and the first cooling channels 19A.

Other details of the channel plate 12, the first cooling channels 19A, and the recessed area 18 of the heat exchanger 10A may be described in U.S. Pat. No. 9,596,785 B2 and in U.S. patent application Ser. No. 16/539,226 filed Aug. 13, 2019, both to assignee Pratt & Whitney Canada Corp., the entire contents of each of which are incorporated by reference herein.

The description herein of the recessed area 18 and the first cooling channels 19A on the first side 13A of the channel plate 12 applies mutatis mutandis to the recessed area 18 and the second cooling channels 19B on the second side 13B of the channel plate 12 shown in FIG. 2.

Referring to FIG. 2, the first cooling channels 19A are separate from the second cooling channels 19B. The first cooling channels 19A are fluidly disconnected from the second cooling channels 19B. The first cooling channels 19A are fluidly independent of the second cooling channels 19B. FIG. 2 shows a second fluid inlet 28B having an opening formed in the outer surface on the first side 13A of the channel plate 12. The opening of the second fluid inlet 28B is located on one of the protrusions 26 extending outwardly from one of the lateral side walls 12B. The second fluid inlet 28B extends into one of the protrusions 26 extending outwardly from one of the lateral side walls 12B. The second fluid inlet 28B extends from the outer surface 16 and through part of the body of the channel plate 12 to fluidly communicate with the inlets 21 of the second cooling channels 19B. The second fluid inlet 28B is thus common to all of the second cooling channels 19B because it supplies the coolant to the inlets 21 of all the second cooling channels 19B. The channel plate 12 has a second fluid outlet 29B common to all of the second cooling channels 19B because it receives the coolant discharged from the outlets of all the second cooling channels 19B.

The second fluid inlet 28B is separate from the first fluid inlet 28A. The second fluid outlet 29B is separate from the first fluid outlet 29A. By "separate", it is understood that coolant is prevented from flowing between the first and second fluid inlets 28A,28B, and between the first and second fluid outlets 29A,29B. The first and second fluid inlets 28A,28B and the first and second fluid outlets 29A, 29B may have different configurations to achieve such functionality, some of which are described in greater detail below. The separateness of the first and second fluid inlets 28A,28B and the first and second fluid outlets 29A,29B allows for different coolants to be used in the first and second cooling channels 19A,19B, among other possible advantages. The first and second fluid inlets 28A,28B and the first and second fluid outlets 29A,29B may be located near the center of the channel plate 12 (i.e. equidistantly between the lateral side walls 12B), or laterally offset from the center of the channel plate 12.

One possible configuration of the separateness of the first and second fluid inlets 28A,28B and the first and second fluid outlets 29A,29B is shown in FIG. 2. The channel plate 12 has or defines a barrier 12C between the first and second fluid inlets 28A,28B. The barrier 12C may take any suitable form. For example, in FIG. 2, the barrier 12C is the extent of part of the body of the channel plate 12 that separates the first fluid inlet 28A from the second fluid inlet 28B and ensures that they are not in fluid communication. In FIG. 2, the first fluid inlet 28A is at a first location on the first side 13A of the channel plate 12, and the second fluid inlet 28B is at a second location on the first side 13A that is spaced apart from the first location. The first fluid inlet 28A is positioned along one of the longitudinal side walls 12A while the second fluid inlet 28B is positioned along one of the lateral side walls 12B. In another possible configuration, the barrier 12C is a wall that blocks coolant and prevents it from flowing between the first fluid inlet 28A and the second fluid inlet 28B. In another possible configuration, the first fluid inlet 28A is positioned on the first side 13A of the channel plate 12 and the second fluid inlet 28B is positioned on the second side 13B of the channel plate 12. In such a configuration, the barrier 12C is the thickness of the channel plate 12. Thus the separateness of the first and second fluid inlets 28A,28B and the first and second fluid outlets 29A, 29B may result from these features being on opposite sides 13A,13B of the channel plate 12 or at different locations on the same side 13A,13B.

The separateness of the first and second fluid inlets 28A,28B and the first and second fluid outlets 29A,29B in FIG. 2 allows for the use of different coolants in the plate cooler 10. In one possible configuration, a first coolant flows through the first cooling channels 19A, and a second coolant flows through the second cooling channels. The second coolant is different from the first coolant. By "different", it is understood that the first and second coolants do not have the same heat-exchange potentials or capacities. One example of different coolants is the first coolant being fuel, and the second coolant being oil, or vice versa. Other coolants are possible. In an embodiment, the first and second coolants are the same. In an embodiment, the first and second coolants have the same heat-exchange potential or capacity, and may both be fuel, for example.

Figure 6:
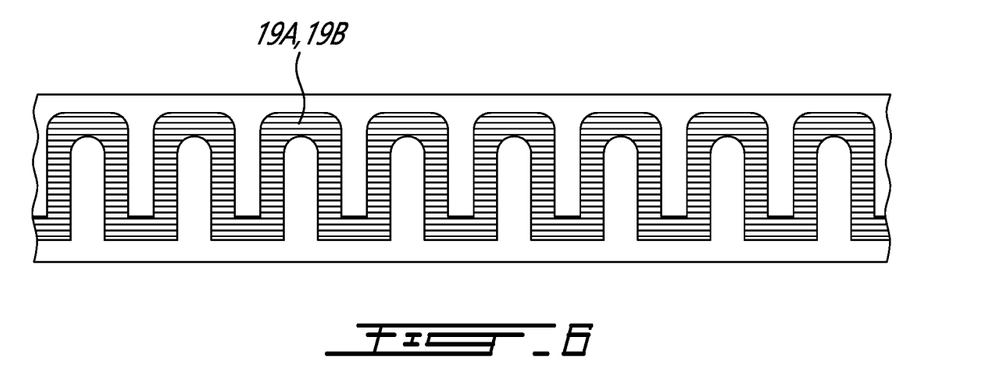
FIG. 6 is a view of cooling channels of the heat exchanger of FIG. 1A.
Figure 7:
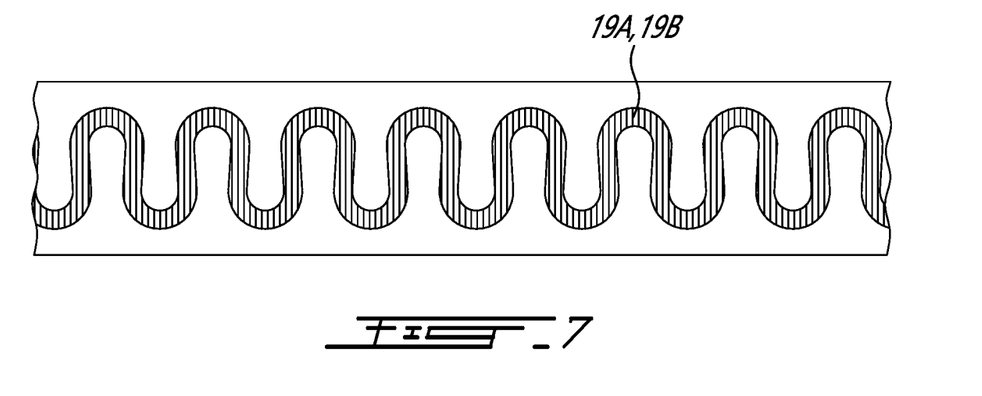
FIG. 7 is a view of other cooling channels of the heat exchanger of FIG. 1A.

The separateness of the first and second fluid inlets 28A,28B and the first and second fluid outlets 29A,29B in FIG. 2 allows for the first and second cooling channels 19A,19B to have different geometries or shapes. In FIG. 2, the first cooling channels 19A have a first geometric configuration and the second cooling channels 19B have a second geometric configuration that is different from the first geometric configuration. For example, in FIG. 2, the first cooling channels 19A have a geometric configuration shown in FIG. 6, and the second cooling channels 19B have a geometric configuration shown in FIG. 7. The geometric configurations of the first and second cooling channels 19A,19B may be reversed. The different geometric configurations may allow for establishing different capabilities for heat exchange in the first and second cooling channels 19A,19B. In an alternate embodiment, an example of which is provided below, the first and second cooling channels 19A,19B have the same geometric configuration. Thus the first and second cooling channels 19A,19B geometry may be the same or differ according to the coolant chosen and its respective viscosity, among other factors. In an embodiment, the first cooling channels 19A are offset, either laterally or longitudinally, from the second cooling channels 19B. For example, the second cooling channels 19B may be offset in a direction parallel to the longitudinal side walls 12A by a row of the first cooling channels 19A. The orientation of the first and second cooling channels 19A,19B may differ or may be the same. For example, the first cooling channels 19A in FIG. 2 extend along a direction parallel to the lateral side walls 12B, and the second cooling channels 19B extend along a direction parallel to the longitudinal side walls 12A.

Referring to FIG. 2, the side-by-side arrangement of the first cooling channels 19A allows the coolant to flow on the first side 13A of the channel plate 12 from the first fluid inlet 28A, through the first cooling channels 19A, and to the first fluid outlet 29A in a first direction of coolant flow D1. The side-by-side arrangement of the second cooling channels 19B allows the coolant to flow on the second side 13B of the channel plate 12 from the second fluid inlet 28B, through the second cooling channels 19B, and to the second fluid outlet 29B in a second direction of coolant flow D2. The first direction of coolant flow D1 lies in a first plane that is parallel to the floor 18A of the channel plate 12 on the first side 13A. The second direction of coolant flow D2 lies in a second plane that is parallel to the floor 18A of the channel plate 12 on the second side 13B. In FIG. 2, the first and second planes are parallel. In FIG. 2, the first and second planes are parallel and spaced apart from each other in direction that is perpendicular to the first and second planes. In FIG. 2, the first and second planes are vertically spaced apart from each other. The first and second directions of coolant flow D1,D2 are defined by the shape or arrangement of the first and second cooling channels 19A,19B, respectively. For example, in FIG. 2, the first and second cooling channels 19A,19B define a tortuous or serpentine flow path between their ends. Consequently, the first and second directions of coolant flow D1,D2 form a tortuous or serpentine path.

The flow of coolant through the first and second channels 19A,19B may be reversed. For example, when the PCU 11 is functional and generating a heat load, such as during operation of the aircraft, the first and second directions of coolant flow D1,D2 may be reversed. This may allow the inlet to provide coolant flow nearest to the location of the largest value of the dynamic heat load. In such a situation, the coolant flows on the first side 13A of the channel plate 12 from the first fluid outlet 29A, through the first cooling channels 19A, and to the first fluid inlet 28A in a direction opposite to the first direction of coolant flow D1. In such a situation, the coolant flows on the second side 13B of the channel plate 12 from the second fluid outlet 29B, through the second cooling channels 19B, and to the second fluid inlet 28B in a direction opposite to the second direction of coolant flow D2.

Referring to FIG. 2, the second direction of coolant flow D2 is transverse to the first direction of coolant flow D1. The second direction of coolant flow D2 is non-parallel to the first direction of coolant flow D1. When the first and second directions of coolant flow D1,D2 are projected into a common plane, an angle is formed between the first and second directions of coolant flow D1,D2. The angle has a magnitude greater than zero. In FIG. 2, the second direction of coolant flow D2 is perpendicular to the first direction of coolant flow D1. In an alternate embodiment, the second direction of coolant flow D2 is oblique to the first direction of coolant flow D1. Other non-perpendicular angles are possible. Ignoring the relatively minor winding or serpentine deviations, in FIG. 2, the second direction of coolant flow D2 is generally parallel to the longitudinal side walls 12A of the channel plate 12. Ignoring the relatively minor winding or serpentine deviations, in FIG. 2, the first direction of coolant flow D1 is generally parallel to the lateral side walls 12B of the channel plate 12.

The first and second directions of coolant flow D1,D2 thus form a "cross-flow" pattern on their respective sides 13A, 13B of the channel plate 12. Such a cross-flow pattern may help to better evacuate heat from the channel plate 12. For example, such a cross-flow pattern may be applied if the power electronics mounted to the plate cooler 10 create a concentrated heat source at a specific location on the plate cooler 10. The plate cooler 10 shown in FIG. 2 allows for coolant to flow through cooling channels 19A,19B on both sides of the plate cooler 10, such as along top and bottom sides, and in directions that are transverse or crosswise to each other.

Figure 3:
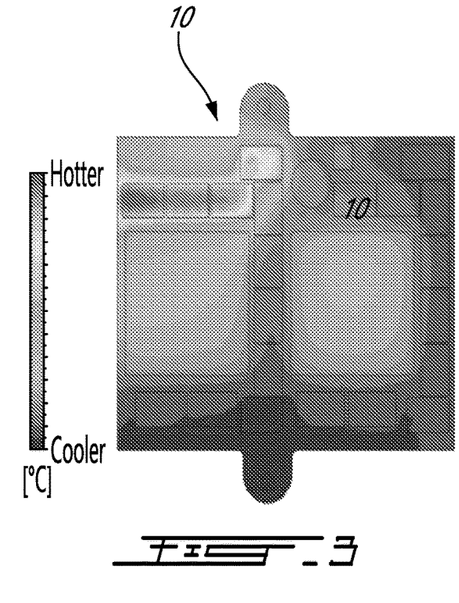
FIG. 3 is a heat map of the heat exchanger of FIG. 1A showing a heat load distribution.
Figure 4:
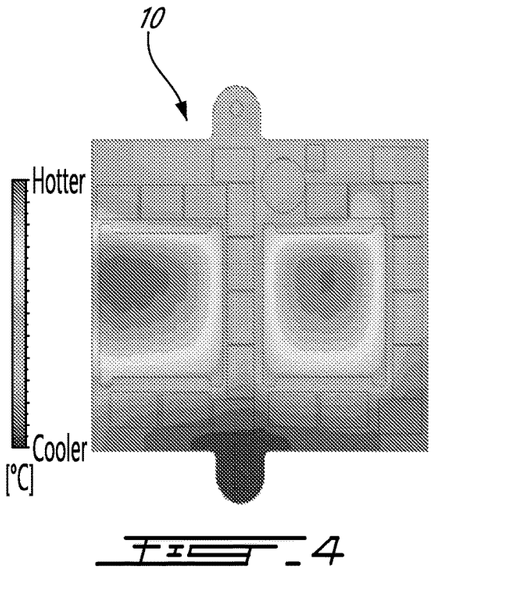
FIG. 4 is another heat map of the heat exchanger of FIG. 1A showing another heat load distribution.

When the electronic components are functioning and generating heat, the heat is often not distributed evenly over the plate cooler 10. Indeed, FIGS. 3 and 4 show examples of heat loads and heat load distributions on the plate cooler 10 generated by some configurations of the electronic components. In FIG. 3, the highest value of the heat load distribution is located adjacent to the top left corner of the plate cooler 10. In FIG. 4, the highest values of the heat load distribution are located along the middle of the plate cooler 10. The location of the highest or largest value for the heat load distribution may be identified, and one or both of the first fluid inlet 28A and the second fluid inlet 28B may be positioned on the plate cooler 10 to allow for introducing coolant into the plate cooler 10 adjacent to, or at, the location of the highest value for the heat load distribution. The coolant, when first introduced into the plate cooler 10, is typically at its lowest temperature and thus has the greatest potential to absorb heat at the locations of highest heat load.

In operation, the location of the highest heat load may change. For example, during a take-off condition, certain electronic components are generating heat, while during other conditions such as cruise, other electronic components are generating heat. These electronic components may be mounted in various locations across the PCU 11. Thus, different electronic components may be employed and create a dynamic heat load profile. The plate cooler 10 may be configured for the highest heat load at the worst case condition, but in addition, may also allow for the direction of the fluid to be switched, by reversing the first and second directions of coolant flow D1,D2, in order to optimize the cooling in areas generating the highest heat load during transient conditions in flight. Furthermore, additional flow control valves may be employed to increase flow as needed during various operating conditions. Valves may be located on both sides of the inlet 28A,228B and the outlet 29A,29B. For example, if the first and second directions of coolant flow D1,D2 are reversed, the inlet 28A,28B becomes the outlet 29A,29B and the valve upstream the respective inlet may be employed. In an embodiment, a control system is operable to switch flow direction of coolant according to the heat load profile of the electronic components, which may vary with the operating conditions of the engine.

For example, and referring to FIG. 2, the area of the cooling plate 12 where the highest value for the heat load distribution is expected to occur is shown as HLA on the first side 13A of the channel plate 12. The first and second fluid inlets 28A,28B are positioned on the first side 13A near the area HLA to introduce coolant first into the first and second cooling channels 19A,19B in the area HLA. In an alternate embodiment, only one of the first and second fluid inlets 28A,28B is positioned near the area HLA to introduce coolant first into their respective first and second cooling channels 19A,19B.

The area HLA may be any area of the cooling plate 12 where any undesirable value of heat load distribution is expected to occur, even if the undesirable value is not the "highest" value. One non-limiting example of an undesirable value is a highly concentrated heat load, particularly from an electronic component which is employed throughout the full duration of the flight, rather than intermittently. The use of "highest" herein should therefore not be understood to mean that the area HLA must always be where the highest value for the heat load distribution is expected to occur. The plate cooler 10 shown in FIG. 2 may therefore allow for keeping an even coolant flow distribution across all the cooling channels 19A,19B, while providing the side 13A,13B of the plate cooler 10 that experiences a higher heat load with targeted coolant flow that cross-flows through the plate cooler 10 from the one or more fluid inlets 28A,28B located adjacent the area HLA of the higher heat load.

Figure 5A:
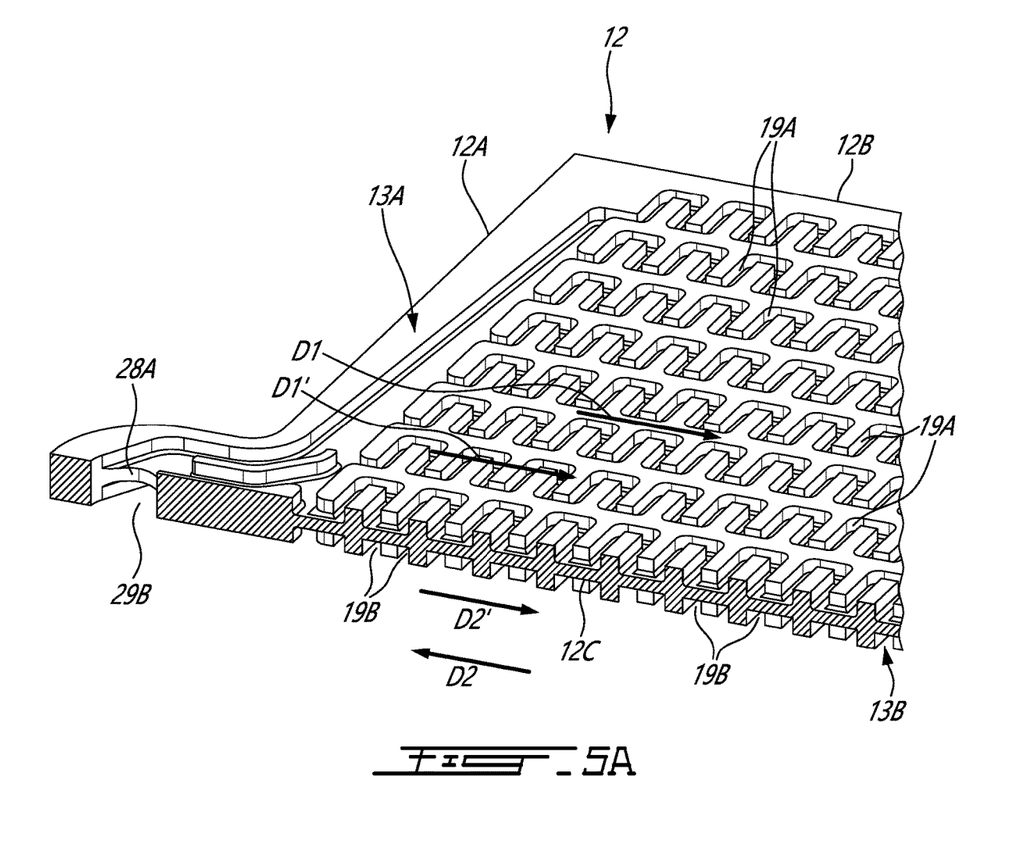
FIG. 5A is a perspective view of the heat exchanger of FIG. 1A, being sectioned along line II-II in FIG. 1A to show another interior thereof.
Figure 5B:
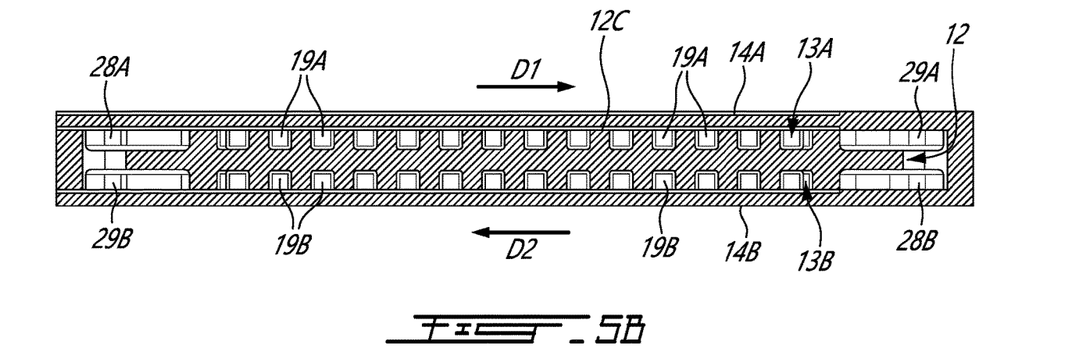
FIG. 5B is a front view along the section of the heat exchanger of FIG. 5A.

Another possible configuration of the channel plate 12 is shown in FIGS. 5A and 5B. The structure and layout of the channel plate 12 is similar to that of the channel plate 12 describe in FIG. 2, and thus the description of the channel plate 12 in FIG. 2, its features, and the reference numbers of these features apply mutatis mutandis to the channel plate 12 in FIGS. 5A and 5B. Referring to FIG. 5B, the first fluid inlet 28A is positioned on the first side 13A of the channel plate 12, and the second fluid outlet 29B is positioned on the second side 13B. The second fluid outlet 29B is aligned with the first fluid inlet 28A and shares a common opening through the channel plate 12. Similarly, the second fluid inlet 28B is positioned on the second side 13B of the channel plate 12, and the first fluid outlet 29A is positioned on the first side 13A. The second fluid inlet 28B is aligned with the first fluid outlet 29A and shares a common opening through the channel plate 12. The first and second cooling channels 19A,19B are fluidly independent, such that the coolant flowing through the first cooling channels 19A does not mix or engage with the coolant flowing through the second cooling channels 19B, and vice versa. The barrier 12C between the first and second cooling channels 19A,19B is the thickness of the channel plate 12. The first and second cooling channels 19A,19B have the same geometric configuration, such as the one shown in FIG. 6.

In FIGS. 5A and 5B, the side-by-side arrangement of the first cooling channels 19A allows the coolant to flow on the first side 13A of the channel plate 12 from the first fluid inlet 28A, through the first cooling channels 19A, and to the first fluid outlet 29A in the first direction of coolant flow D1. The side-by-side arrangement of the second cooling channels 19B allows the coolant to flow on the second side 13B of the channel plate 12 from the second fluid inlet 28B, through the second cooling channels 19B, and to the second fluid outlet 29B in the second direction of coolant flow D2. In FIGS. 5A and 5B, the second direction of coolant flow D2 is counter to the first direction of coolant flow D1. The second direction of coolant flow D2 is opposite to the first direction of coolant flow D1. When the first and second directions of coolant flow D1,D2 are projected into a common plane, an angle is formed between the first and second directions of coolant flow D1,D2. The angle has a magnitude of zero when the second direction of coolant flow D2 is directly opposite to the first direction of coolant flow D1. The angle has a magnitude greater than zero when the second direction of coolant flow D2 is not directly counter to the first direction of coolant flow D1. Ignoring the relatively minor winding or serpentine deviations, in FIGS. 5A and 5B, the first and second directions of coolant flow D1,D2 are generally parallel to the lateral side walls 12B of the channel plate 12.

The first and second directions of coolant flow D1,D2 in FIGS. 5A and 5B thus form a "counter-flow" pattern on their respective sides 13A,13B of the channel plate 12. Such a counter-flow pattern may help to better evacuate heat from the channel plate 12. For example, such a counter-flow may be applied, for example if the power electronics layout provides a relatively even heat distribution across the first and second cooling channels 19A,19B. The plate cooler 10 shown in FIGS. 5A and 5B allow for coolant to flow through cooling channels 19A,19B on both sides of the plate cooler 10, such as along top and bottom sides, and in directions that are counter to each other.

Referring to FIGS. 5A and 5B, the first fluid inlet and outlet 28A,29A, and the second fluid inlet and outer 28B, 29B may be arranged on sides of the channel plate 12 such that the first and second directions of coolant flow D1',D2' are parallel to one another, and thus form a "parallel" pattern on their respective sides 13A,13B of the channel plate 12 (see FIG. 5A). Such a parallel flow pattern may help to evacuate heat from the channel plate 12.

Referring to FIGS. 2, 5A and 5B, there is disclosed a method of distributing coolant through the plate cooler 10. The method includes directing the coolant through the first cooling channels 19A on the first side 13A along the first direction of coolant flow D1, and directing the coolant through the second cooling channels 19B on the second side 13B along the second direction of coolant flow D2. The second direction of coolant flow D2 is transverse or counter to the first direction of coolant flow D1.

Referring to FIG. 2, there is also disclosed method of manufacturing the plate cooler 10. The method may include diffusion bonding the channel plate 12 and first plate 14A together. The outer surface 16 of the channel plate 12 and the protrusions 26 may provide structural support for the diffusion bonding process. The assembled plate cooler 10 may be permanently mounted to the PCU 11 housing via diffusion bonding. The cooling channels 19A,19B of the channel plate 12 may be manufactured via additive manufacturing methods including, but not limited, to direct metal laser sintering (DMLS) and electron beam melting (EBM). The cooling channels 19A,19B may be machined. Other manufacturing techniques, such as those described in U.S. Pat. No. 9,596, 785 B2 incorporated by reference herein, may also apply.

The above description is meant to be exemplary only, and one skilled in the art will recognize that changes may be made to the embodiments described without departing from the scope of the invention disclosed. For example, although the recessed area 18 and its features (e.g. the cooling channels 19A,19B, the fluid supply and exit manifolds 22,24, and the recessed protrusion area 26A) are described above as being defined in the channel plate 12, it will be appreciated that the recessed area 18 and its features may be defined in the first plate 14A and second plate 14B, or in all of the channel plate 12, the first plate 14A and the second plate 14B. Still other modifications which fall within the scope of the present invention will be apparent to those skilled in the art, in light of a review of this disclosure, and such modifications are intended to fall within the appended claims.

The invention claimed is:

1. An aircraft electronic component cooling assembly comprising:
an aircraft electronic component; and
a plate cooler mounted to the aircraft electronic component, the plate cooler incuding a channel plate having a first side and a second side opposite to the first side, the first side having a first recessed area delimited by a first inner wall, the first recessed area defining first cooling channels on the first side of the channel plate, the second side having a second recessed area delimited by a second inner wall, the second recessed area defining second cooling channels on the second side of the channel plate, the first cooling channels arranged side-by-side in a first direction of coolant flow from a first common inlet to a first outlet, the first common inlet including a first supply manifold delimited by the first inner wall of the first recessed area in the first side of the channel plate, the second cooling channels arranged side-by-side in a second direction of coolant flow from a second common inlet separate from the first common inlet to a second outlet separate from the first outlet, the second direction of coolant flow being transverse or counter to the first direction of coolant flow, the second common inlet including a second supply manifold delimited by the second inner wall of the second recessed area in the second side of the channel plate.

2. The aircraft electronic component cooling assembly of claim 1, wherein a heat load distribution is generated along the plate cooler by the aircraft electronic components during operation thereof, one or both of the first and second common inlets positioned on the respective first or second sides adjacent a location of a largest value of the heat load distribution.

3. The aircraft electronic component cooling assembly of claim 1, wherein a heat load distribution is generated along the plate cooler by the aircraft electronic components during operation thereof, the first and second common inlets positioned on the respective first and second sides adjacent a location of a largest value of the heat load distribution.

4. The aircraft electronic component cooling assembly of claim 1, wherein the channel plate has first channel separators extending away from a first floor on the first side of the channel plate and defining the first cooling channels, and the channel plate has second channel separators extending away from a second floor on the second side of the channel plate and defining the second cooling channels, the first and second floors and the first and second channel separators being integral, a first plate mounted to the first side of the channel plate to enclose the first cooling channels, and a second plate mounted to the second side of the channel plate to enclose the second cooling channels, the aircraft electronic component mounted to one of the first plate and the second plate.

5. The aircraft electronic component cooling assembly of claim 1, wherein the channel plate comprises a barrier between the first and second common inlets.

6. The aircraft electronic component cooling assembly of claim 1, wherein the first common inlet is at a first location on the first side of the channel plate, and the second common inlet is at a second location on the first side spaced apart from the first location.

7. The aircraft electronic component cooling assembly of claim 1, wherein the first common inlet is at a first location on the first side of the channel plate, and the second common inlet is at a second location on the second side of the channel plate.

8. The aircraft electronic component cooling assembly of claim 1, wherein the second direction of coolant flow is normal to the first direction of coolant flow.

9. The aircraft electronic component cooling assembly of claim 1, wherein the first cooling channels have a first geometric configuration and the second cooling channels have a second geometric configuration different from the first geometric configuration.

10. The aircraft electronic component cooling assembly of claim 1, wherein the first cooling channels have a geometric configuration and the second cooling channels have the same geometric configuration.

11. A method of distributing coolant through a plate cooler for aircraft electronic components, the method comprising:
   directing a first coolant through first cooling channels defined in a first recessed area in a first side of a plate of the plate cooler along a first direction of coolant flow, including directing the first coolant in a first manifold formed in the first recessed area; and
   directing a second coolant through second cooling channels defined in a second recessed area in second side of the plate of the plate cooler along a second direction of coolant flow transverse or counter to the first direction of coolant flow, including directing the second coolant in a second manifold formed in the second recessed area.

12. The method of claim 11, wherein one or both of directing the first coolant through the first cooling channels and directing the second coolant through the second cooling channels includes introducing the first coolant and/or the second coolant into the plate cooler adjacent a location having a largest value for a heat load generated by the aircraft electronic components during operation thereof.

13. The method of claim 11, wherein directing the first coolant through the first cooling channels includes introducing the first coolant into the first cooling channels at a first location of the plate cooler, and directing the second coolant through the second cooling channels includes introducing the second coolant into the second cooling channels at a second location of the plate cooler spaced apart from the first location.

14. The method of claim 11, wherein the second coolant is different than the first coolant.

15. A heat exchanger for aircraft electronic components, comprising:
   a channel plate defining first cooling channels on a first side of the channel plate and second cooling channels on a second side of the channel plate opposite to the first side, the first cooling channels defined within a confine of a first recessed area in the first side of the channel plate, the first recessed area circumscribed by a first inner wall, the first inner wall delimiting a first manifold in the first side of the channel plate, the second cooling channels defined within a confine of a second recessed area in the second side of the channel date, the second recessed area circumscribed by a second inner wall, the second inner wall delimiting a second manifold in the second side o the channel plate, the first cooling channels arranged side-by-side in a first direction of coolant flow from a first common inlet to a first outlet, the second cooling channels arranged side-by-side in a second direction of coolant flow from a second common inlet separate from the first common inlet to a second outlet separate from the first outlet, the second direction of coolant flow being transverse or counter to the first direction of coolant flow; and
   an upper plate mounted to the first side of the channel plate to enclose the first cooling channels and the first manifold, and a lower plate mounted to the second side of the channel plate to enclose the second cooling channels and the second manifold.

\* \* \* \* \*